US005616230A

United States Patent [19]

Otsuka et al.

[11] Patent Number: 5,616,230
[45] Date of Patent: Apr. 1, 1997

[54] METHOD FOR DIRECT-ELECTROPLATING AN ELECTRICALLY NONCONDUCTIVE SUBSTRATE

[75] Inventors: Kuniaki Otsuka, Osaka; Kazue Yamamoto, Sakai; Satoshi Konishi, Nishinomiya; Shigeru Yamato, Osaka, all of Japan

[73] Assignee: Okuno Chemical Industries Co., Ltd., Osaka, Japan

[21] Appl. No.: 374,576

[22] PCT Filed: May 24, 1994

[86] PCT No.: PCT/JP94/00826

§ 371 Date: Jan. 24, 1995

§ 102(e) Date: Jan. 24, 1995

[30] Foreign Application Priority Data

May 24, 1993 [JP] Japan .................................. 5-121311

[51] Int. Cl.$^6$ ............................. C25D 5/02; C25D 5/54; C25D 5/56; C25D 5/34
[52] U.S. Cl. ........................ 205/125; 205/126; 205/159; 205/162; 205/163; 205/164; 205/165; 205/166; 205/183; 205/205; 205/210
[58] Field of Search .................................... 205/125, 126, 205/159, 162, 163, 164, 165, 166, 183, 205, 210; 106/1.28; 252/518

[56] References Cited

U.S. PATENT DOCUMENTS

| | | | |
|---|---|---|---|
| 4,255,194 | 3/1981 | Hough et al. | 106/1.24 |
| 4,316,779 | 2/1982 | Yahalom | 205/205 |
| 4,810,333 | 3/1989 | Gulla et al. | 204/15 |
| 4,873,136 | 10/1989 | Foust et al. | 205/210 |
| 4,988,413 | 1/1991 | Chakravorty et al. | 205/205 |

FOREIGN PATENT DOCUMENTS

| | | |
|---|---|---|
| 63-227784 | 9/1988 | Japan . |
| 2-153077 | 6/1990 | Japan . |
| 2-175895 | 7/1990 | Japan . |
| 3-22467 | 3/1991 | Japan . |
| 3-267393 | 11/1991 | Japan . |

*Primary Examiner*—Kathryn Gorgos
*Assistant Examiner*—Edna Wong
*Attorney, Agent, or Firm*—Armstrong, Westerman, Hattori, McLeland & Naughton

[57] ABSTRACT

A process for plating an electrically nonconductive substrate by the following sequence of steps:

(1) a step of treating an electrically nonconductive substrate with a solution containing a silane coupling agent;

(2) a step of treating the electrically nonconductive substrate from said step (1) with a solution containing an anionic surfactant;

(3) a step of the electrically nonconductive substrate from said step (2) with a solution containing a palladium compound and at least one nitrogen-containing sulfur compound selected from among thiourea and its derivatives;

(4) a step of treating the electrically nonconductive substrate from said step (3) with a reducing solution containing at least one member selected from among sodium borohydride, sodium hypophosphite, hydrazine, dimethylaminoborane, hydroxylamine and glyoxylic acid; and (5) a step of forming an electroplating layer on the electrically nonconductive substrate from said step (4).

With this process, improved productivity is obtained through process simplification, reduced treating time and improved working environment.

6 Claims, No Drawings

METHOD FOR DIRECT-ELECTROPLATING AN ELECTRICALLY NONCONDUCTIVE SUBSTRATE

This is a 371 of PCT/JP94/00826 filed May 24, 1994.

TECHNICAL FIELD

This invention relates to a technology for direct-electroplating an electrically nonconductive substrate. This technology is suited for the direct electroplating of the walls defining through-holes of a printed circuit board, for instance.

In this specification, "%" means "% by weight".

BACKGROUND ART

In through-hole plating for the manufacture of a printed circuit board, the subtractive process is most frequently utilized. The subtractive process comprises drilling through-holes in a substrate consisting of an insulating board and a copper foil cladding disposed on either side thereof, causing a thin electroless copper plate to precipitate on the nonconductive walls defining the through-holes to render them electrically conductive, and depositing a thick copper electroplating layer to establish electrical connection between the copper foils and thereby complete an electric circuit.

This is a reliable technology well-established and use-tested over about a couple of decades. However, this process involves electroless plating as an essential step and this step requires a complicated pretreatment for rendering the nonconductive surfaces electrically conductive. The plating solution for use in electroless plating is so self-decomposing as to call for meticulous control over the bath composition. Moreover, as a reducing agent required for precipitation of copper, the use of formaldehyde which is a highly toxic material is essential. A further disadvantage of the process is that it takes a long time even to attain quite a thin copper layer.

DISCLOSURE OF INVENTION

The principal object of this invention, therefore, is to provide a technology for rendering nonconductive areas electrically conductive by mere copper electroplating without resort to electroless copper plating which is a major technical drawback of the prior art, which technology provides for improved productivity through process simplification, reduction of processing time and improved working environment.

In view of the state of the art sketched above, the inventors of this invention did much research and found that the above-mentioned object can be accomplished by using certain processing steps in a specific combination. The inventors further discovered that this specific combination of steps can be applied with advantage to the direct formation of copper electroplating layers on nonconductive substrates in general.

This invention, therefore, provides the following processes.

1. A process for plating an electrically nonconductive substrate characterized in that said substrate is treated in the following sequence of steps:
(1) a step of treating an electrically nonconductive substrate with a solution containing a silane coupling agent;
(2) a step of treating the electrically nonconductive substrate from said step (1) with a solution containing an anionic surfactant;
(3) a step of treating the electrically nonconductive substrate from said step (2) with a solution containing a palladium compound and at least one nitrogen-containing sulfur compound selected from among thiourea and its derivatives;
(4) a step of reductively treating the electrically nonconductive substrate from said step (3) with a reducing solution containing at least one member selected from among sodium borohydride, sodium hypophosphite, hydrazine, dimethylaminoborane, hydroxylamine and glyoxylic acid; and
(5) a step of forming an electroplating layer on the electrically nonconductive substrate from said step (4).

2. The plating process as defined above in item 1 wherein the concentration of palladium ion in the treating solution for use in said step (3) is 0.1–10 g/l and the concentration of said nitrogen-containing sulfur compound is 1–50 moles per mole of said palladium ion.

3. The plating process as defined above in item 2 wherein said nitrogen-containing sulfur compound is any of thiourea, thioacetamide, thiosemicarbazide and dimethylthiourea.

4. A through-hole plating process for a printed circuit board characterized in that a double-sided printed circuit board or a multi-layer printed circuit board is treated in the following sequence of steps:
(1) a step of treating a drilled, polished and cleaned printed circuit board with a solution containing a silane coupling agent;
(2) a step of treating the printed circuit board from said step (1) with a solution containing an anionic surfactant;
(3) a step of treating the printed circuit board from said step (2) with a solution containing a palladium compound and at least one nitrogen-containing sulfur compound selected from among thiourea and its derivatives;
(4) a step of reductively treating the printed circuit board from said step (3) with a reducing solution containing at least one member selected from among sodium borohydride, sodium hypophosphite, hydrazine, dimethylaminoborane, hydroxylamine and glyoxylic acid; and
(5) a step of forming an electroplating layer directly on the printed circuit board from said step (4).

5. The plating process as defined above in item 4 wherein the concentration of palladium ion in the treating solution for use in said step (3) is 0.1–10 g/l and the concentration of the nitrogen-containing sulfur compound is 1–50 moles per mole of said palladium ion.

6. The plating process as defined above in item 5 wherein said nitrogen-containing sulfur compound is any of thiourea, thioacetamide, thiosemicarbazide and dimethylthiourea.

In accordance with the technology of this invention, a copper electroplating layer can be directly formed not only on the nonconductive surfaces defining the through-holes of a double-sided or multi-layer printed circuit board but also on the exposed surfaces of other electrically nonconductive materials such as plastics, ceramics, glass and composites thereof. In the following description, however, the respective steps involved are described taking the direct formation of a copper electroplating layer on the nonconductive walls defining the through-holes of a double-sided or multi-layer laminate printed circuit board as an example.

Treatment with silane-coupling agent

In the technology of this invention, a previously drilled, polished and cleaned printed circuit board (hereinafter referred to briefly as a substrate) is treated with a solution containing a silane coupling agent to form a molecular film of the silane coupling agent on the surface of said substrate. The silane coupling agent that can be used includes amino-containing water-soluble silane compounds such as 3-aminopropyltriethoxysilane, N-2-(aminoethyl)-3-aminopropyltrimethoxysilane, etc. and organic solvent-soluble silane compounds such as vinyltrimethoxysilane, 3-glycidoxytrimethoxysilane and so on. Preferred for purposes of this invention is an amino-containing water-soluble silane compound.

The concentration of the silane coupling agent in the treating solution is not so critical but is appropriately about 0.5–50 g/l and preferably about 1–10 g/l. The solvent may be water for a water-soluble silane coupling agent and an alcohol, such as methanol, ethanol, propanol, butanol, etc., for an organic solvent-soluble silane coupling agent.

The solution of such silane coupling agent may be supplemented with a surfactant where necessary. Inclusion of a surfactant reduces the surface tension of the treating solution to improve its wettability and penetrability with respect to the substrate and, hence, the desired effect of the silane coupling agent. It also contributes to an improved cleaning of the substrate. The type of surfactant is not so critical and any of nonionic, anionic, cationic and ampholytic surfactants can be employed. The amount of the surfactant is not so critical, either, but can generally be up to 10 g/l. The following is a partial listing of effective surfactants.

Nonionic surfactant: polyoxyethylene lauryl ether, polyoxyethylene nonylphenyl ether, etc.

Anionic surfactant: sodium dodecylbenzene sulfonate, sodium ethylhexyl alkyl sulfate, etc.

Cationic surfactant: alkyldimethylbenzyl ammonium chloride, alkyltrimethyl ammonium chloride, etc.

Ampholytic surfactant: dimethylalkylbetaine, dimethylalkyllaurylbetaine, etc.

The method of treating the substrate with said solution containing a silane coupling agent is not so critical but may generally be as simple as immersing the substrate in a solution containing the silane coupling agent. The treating conditions are not so critical, but, by way of illustration, the treating solution temperature may be about 20°–90° C., preferably about 50°–80° C., and the treating time may be about 1–10 minutes, preferably about 3–5 minutes.

In the technology of this invention, a treatment with a strongly acid solution can be carried out, where necessary, following said treatment with a solution containing the silane coupling agent. This treatment with a strongly acid solution hydrolyzes the silane coupling agent to thereby improve adhesion. The treatment further enhances the adsorptive affinity of the anionic surfactant for the substrate in the next step and improves the adhesion of metallic palladium in the subsequent step. The strongly acid solution can be any solution that causes the hydrolysis of the silane coupling agent. Among typical examples are an aqueous solution containing 20–200 g/l, preferably 100–200 g/l, of sulfuric acid (98%) and an aqueous solution containing 10–100 g/l, preferably 50–100 g/l, of hydrochloric acid (36%). The treating method is generally not so critical and can generally be as simple as immersing the substrate in the solution. The treating conditions are not so critical, but, by way of illustration, the treating solution temperature may be about 20°–50° C. preferably about 20°–40° C. and the treating time may be about 1–10 minutes, preferably about 3–5 minutes.

Anionic surfactant treatment

The substrate is then treated with a solution containing an anionic surfactant. By this treatment is the anionic surfactant adsorbed on the substrate surface to render the surface anionic. The anionic surfactant that can be used includes sulfonic acid type, phosphoric ester type, alkyl sulfate type, alkyl ether sulfate type, sulfosuccinate type and other types of surfactants. The solvent for such an anionic surfactant solution can generally be water.

The treating method is not so critical and can generally be as simple as immersing the substrate in the treating solution. The treating solution formulation and treating conditions are not so critical, either, but can be typically as follows.

| Anionic surfactant | 0.1–50 g/l, preferably 0.5–10 g/l |
|---|---|
| Treating temperature | 20–50° C., preferably 20–40° C. |
| Treating time | 1–10 minutes, preferably 3–5 minutes |

Treatment for adhesion of palladium salt

The substrate is then treated with a solution containing a palladium compound and at least one nitrogen-containing sulfur compound selected from among thiourea and its derivatives.

The thiourea derivatives that can be used are thioacetamide, thiosemicarbazide, dimethylthiourea, diethylthiourea and ethylenethiourea, to mention just a few examples. The palladium compound that can be used includes water-soluble salts of palladium such as the chloride, sulfate, acetate and so on. The solvent can generally be water.

The treating method is not so critical but can generally be as simple as immersing the substrate in the solution. The formulation of the treating solution and the treating conditions are not so critical, either, but may for example be as shown below.

| Palladium ion | 0.1–10 g/l, preferably 0.2–5 g/l |
|---|---|
| Nitrogen-containing sulfur compound | 1–100 moles, preferably 1–50 moles, per mole of palladium ion |
| Bath pH | 1–12, preferably 4–10 |
| Treating temperature | 10–50° C., preferably 20–40° C. |
| Treating time | 1–10 minutes, preferably 3–5 minutes |

The preparation method of the treating solution is not so critical but when the palladium compound cannot be easily dissolved, one may first dissolve the palladium compound with the aid of an acid, then add the nitrogen-containing sulfur compounds and adjust the pH of the solution with an alkali metal salt. When palladium chloride, for instance, is used as the palladium compound, it can be dissolved by adding 0.5 ml or more of 36% hydrochloric acid per gram of palladium chloride and, then, the nitrogen-containing sulfur compound be added. The type of alkali metal salt that can be used for pH adjustment is not critical and a variety of water-soluble salts of alkali metals can be employed. The palladium salt tends to precipitate when the pH of the treating solution exceeds pH 6. In such cases, a chelating agent is preferably added to the treating solution. The type of chelating agent that can be used is not so critical and a known compound which forms a chelate with the palladium salt can be employed. The amount of the chelating agent may be just a sufficient amount to prevent precipitation of the palladium salt.

In the process of this invention, the nitrogen-containing sulfur compound or compounds present in said treating solution form cationic complexes with palladium and such complexes are not only strongly adsorbed on the substrate but serve to prevent substitution of palladium metal on the copper foils of the substrate.

The palladium salt-containing solution mentioned above can be used with particular advantage for the adsorption of the palladium salt and subsequent formation of an electrically conductive layer on an electrically nonconductive substrate in accordance with this invention but can also be used for the adsorption of a palladium salt on the surface of an electrically nonconductive substrate which has been rendered anionic by any other method. An exemplary method for rendering the surface of an electrically nonconductive substrate anionic comprises etching the substrate surface with a permanganate solution to form a manganese oxide layer on the surface. The permanganate solution that can be used for this purpose may be any solution that is conventionally used for etching. Moreover, depending on the type of electrically nonconductive substrate material, the surface may be sufficiently anionic after etching with a permanganate solution and subsequent neutralization for removal of the manganese oxide film or after etching with chromic acid-sulfuric acid (chromic anhydride 350–450 g/l, sulfuric acid 350–450 g/l, 65°–70° C. 8–15 min.) which is commonly used in the pretreatment of a resin material for plating. On such surfaces, the palladium salt can be adsorbed using the above treating solution. After the adsorption of a palladium salt on an electrically nonconductive surface by any of such techniques, reduction and electroplating can be performed in the same manner as the steps described below.

Reduction treatment

The substrate is then subjected to reduction treatment using a reducing aqueous solution containing at least one reducing agent selected from among sodium borohydride, sodium hypophosphite, hydrazine, hydroxylamine and glyoxylic acid. The pH of the reducing aqueous solution is preferably not less than about 10 and more preferably pH about 11–13. If the pH of the solution cannot be brought into the above range with a reducing agent alone, an alkali metal salt can be added for further adjustment. The alkali metal salt that can be used for this purpose includes sodium hydroxide, potassium hydroxide, sodium carbonate, sodium phosphate and so on. The treating method is not so critical and may generally be as simple as immersing the substrate in the solution. The composition of the solution and the treating conditions may generally be as follows.

| Reducing agent | 0.5–20 g/l, preferably 1–10 g/l |
|---|---|
| Alkali metal salt | 0–10 g/l, preferably 1–5 g/l |
| Treating temperature | 20–60° C., preferably 30–40° C. |
| Treating time | 0.5–10 minutes, preferably 1–5 minutes |

The palladium ion adsorbed in the above step is reduced to the pure electrically conductive metal in this step. As a result, the electrically nonconductive substrate can be directly electroplated without resort to electroless plating.

Electroplating

The substrate is thin electroplated in the per se known manner. The formulation of the electroplating bath and the operating conditions are not so critical and any of the known electroplating baths and methods can be utilized. Typical examples of the electroplating bath and operating conditions are as follows.

| Copper sulfate | 40–100 g/l, preferably 60–80 g/l |
|---|---|
| Sulfuric acid | 100–300 g/l, preferably 150–250 g/l |
| Chloride ion | 30–100 mg/l, preferably 40–80 mg/l |
| Brightener | q.s. |
| Treating temperature | 10–40° C., preferably 15–30° C. |
| Cathode current density | 0.5–10 A/dm$^2$, preferably 1–5 A/dm$^2$ |

Copper pyrophosphate plating bath

| Copper pyrophosphate | 50–150 g/l, preferably 70–110 g/l |
|---|---|
| Potassium pyrophosphate | 200–500 g/l, preferably 250–400 g/l |
| Aqueous ammonia (28%) | 1–7 ml/l, preferably 2–4 ml/l |
| Brightener | q.s. |
| Treating temperature | 40–70° C., preferably 50–60° C. |
| Cathode current density | 0.5–8 A/dm$^2$, preferably 1–5 A/dm$^2$ |

This electroplating step is generally preceded by an activation treatment. This activation treatment can be carried out by an ordinary method according to the plating bath to be used. A specific example is as follows.

| Sulfuric acid (98%) | 10–150 ml/l, preferably 50–100 ml/l |
|---|---|
| Treating temperature | 10–30° C., preferably 15–25° C. |
| Treating time | 0.1–3 minutes, preferably 0.5–1 minute |

In the technology according to this invention, where the substrate is a printed circuit board, it is also a good practice to perform soft etching prior to electroplating. Soft etching cleans the substrate by eliminating foreign matter from the copper foil surface for improved adhesion of the electroplate in the subsequent step. Since the palladium metal layer formed in the preceding step does not interfere with adhesion of the electroplate, soft etching can be carried out at any stage prior to electroplating, that is to say before or after any of the steps described above. The composition of the soft etching solution and the treating conditions are not so critical, either, and may typically be as follows.

Persulfate type

| Sodium persulfate or ammonium persulfate | 50–300 g/l, preferably 100–200 g/l |
|---|---|
| Sulfuric acid (98%) | 0–500 ml/l, preferably 5–20 ml/l |
| Treating temperature | 10–40° C., preferably 20–30° C. |
| Treating time | 0.5–3 minutes, preferably 1–2 minutes |

Sulfuric acid-hydrogen peroxide type

| Sulfuric acid (98%) | 10–150 ml/l, preferably 30–100 ml/l |
|---|---|
| Hydrogen peroxide (35%) | 30–200 ml/l, preferably 50–150 ml/l |
| Stabilizer | q.s. |

-continued

| Treating temperature | 10–50° C., preferably 20–40° C. |
| --- | --- |
| Treating time | 0.5–5 minutes, preferably 1–3 minutes |

In the process of this invention, where the substrate is a multilayer printed circuit board, it is good practice to perform desmearing prior to said treatment with a silane coupling agent. The term 'desmearing' means a treatment which is generally carried out in association with the through-hole plating of a multilayer board for eliminating the smear (thermal degradation products) originating from the drilling of the board from depositing on the internal copper layer to interfere with conduction reliability. As means for desmearing, the plasma method, chromic acid method, sulfuric acid method and permanganate method, among others, are available but from the standpoint of prevention of pollution, the permanganate method is predominantly used today. Desmearing by the permanganate method is briefly described below.

Permanganate desmearing (1) Swelling:

The material is treated with an alkaline solution containing a glycol ether solvent to swell the smear for assisting in the oxidative decomposition at a later stage. The composition of the treating solution and the treating conditions for desmearing may for example be as follows.

| Glycol ether solvent | 50–900 ml/l, preferably 100–300 ml/l |
| --- | --- |
| Sodium hydroxide | 1–50 g/l, preferably 5–30 g/l |
| Surfactant | q.s. |
| Treating temperature | 20–80° C., preferably 40–70° C. |

(2) Etching:

The smear is decomposed and removed using a basic permanganate solution. The composition of this etching solution and the treating conditions may for example be as follows.

| Potassium or sodium permanganate | 20–100 g/l, preferably 40–60 g/l |
| --- | --- |
| Potassium or sodium hydroxide | 5–50 g/l, preferably 20–40 g/l |
| Surfactant | q.s. |
| Treating temperature | 50–95° C., preferably 70–90° C. |
| Treating time | 1–15 minutes, preferably 3–10 minutes |

(3) Neutralization:

The manganese oxide (mostly manganese dioxide) formed as the result of said permanganate treatment is dissolved and removed from the substrate. The composition of the treating solution and the treating conditions may for example be as follows.

| Sulfuric acid (98%) | 10–100 g/l, preferably 30–60 g/l |
| --- | --- |
| Reducing agent | q.s. |
| Surfactant | q.s. |
| Treating temperature | 20–60° C., preferably 30–50° C. |
| Treating time | 1–10 minutes, preferably 2–5 minutes |

BEST MODE FOR CARRYING OUT THE INVENTION

The following examples are intended to further clarify the outstanding features of this invention.

EXAMPLE 1

A drilled, polished double-sided copper-clad substrate was treated with an aqueous solution containing 5 g/l of 3-aminopropyltriethoxysilane and 5 g/l of a nonionic surfactant at 70° C. for 5 minutes. The substrate was then rinsed and immersed in an aqueous solution containing 100 g/l of sulfuric acid at 25° C. for 3 minutes. The substrate was further rinsed and immersed in an aqueous bath containing 10 g/l of sodium dodecylbenzene sulfonate at 25° C. for 3 minutes. Thereafter, the substrate was thoroughly rinsed and immersed in a palladium salt-containing aqueous bath of the following composition at 25° C. for 5 minutes.

| Palladium chloride | 1 g/l |
| --- | --- |
| Hydrochloric acid | 1 ml/l |
| Thiourea | 1.5 g/l |
| Adjusted to pH 4 with sodium acetate | |

The substrate was then rinsed and further immersed in a reducing aqueous solution containing 2 g/l of dimethylaminoborane and 1 g/l of sodium hydroxide at 35° C. for 3 minutes. The substrate was rinsed again and treated with a soft etching solution containing 200 g/l of sodium persulfate and 10 ml/l of sulfuric acid (98%) at 25° C. for 1 minute for etch-cleaning of the copper foil portion.

The substrate thus treated was activated in the per se known manner using an aqueous solution containing 100 g/l of sulfuric acid and subjected to copper electroplating with a copper sulfate plating bath of the following composition at 23° C. and 2A/dm$^2$ for 5 minutes.

| Copper sulfate | 70 g/l |
| --- | --- |
| Sulfuric acid | 200 g/l |
| Chloride ion | 50 mg/l |
| Brightener | 2.5 ml/l (Trademark: "TOP LUCINA 81-HL", OKUNO CHEMICAL INDUSTRIES CO., LTD.) |

Upon completion of the above plating step, the walls defining the through-holes of the substrate had been completely covered with the copper plate.

EXAMPLE 2

A drilled, polished double-sided copper-clad substrate board was treated with a treating solution containing 10 g/l of 3-glycidoxytrimethoxysilane in isopropyl alcohol at 25° C. for 3 minutes. The treated substrate was rinsed and immersed in an aqueous solution containing 100 g/l of sulfuric acid at 25° C. for 5 minutes. The substrate was then rinsed and immersed in an aqueous solution containing 5 g/l of polyoxyethylene lauryl ether phosphate at 25° C. for 3 minutes. Thereafter, the substrate was thoroughly rinsed and immersed in a palladium salt-containing aqueous solution of the following composition at 25° C. for 3 minutes.

| | |
|---|---|
| Palladium chloride | 1 g/l |
| Hydrochloric acid | 1 ml/l |
| Thioacetamide | 2 g/l |
| Adjusted to pH 7 with sodium gluconate and sodium hydroxide | |

The substrate was then rinsed and further immersed in a reducing aqueous bath containing 10 g/l of hydrazine and 2 g/l of sodium hydroxide at 40° C. for 5 minutes. The substrate was rinsed again and treated with a soft etching solution containing 70 ml/l of sulfuric acid (98%), 50 ml/l of hydrogen peroxide (35%) and 50 ml/l of a stabilizer (Trademark: "OPC-450 SOFT ETCH", OKUNO CHEMICAL INDUSTRIES CO., LTD.) at 25° C. for 1 minute for etch-cleaning of the copper foil portion. Thereafter, copper electroplating was carried out under the same conditions as in Example 1.

By 3 minutes after the start of electroplating, the walls defining the through-holes of the substrate had been completely covered with the copper electroplate.

EXAMPLE 3

A drilled, polished double-sided copper-clad substrate was treated with an aqueous solution containing 7 g/l of N-2-(aminoethyl)-3-aminopropyltrimethoxysilane and 2 g/l of nonionic surfactant at 75° C. for 3 minutes. The substrate was then rinsed and treated with a soft-etching solution containing 200 g/l of sodium persulfate and 10 ml/l of sulfuric acid (98%) at 25° C. for 1 minute for etch-cleaning the copper foil portion. Then, the substrate was immersed in an aqueous solution containing 100 g/l of sulfuric acid at 25° C. for 2 minutes. The substrate was rinsed again and further immersed in an aqueous solution containing 5 g/l of sodium dioctyl sulfosuccinate at 25° C. for 2 minutes. The substrate was thoroughly rinsed and immersed in a palladium salt-containing aqueous bath of the following formulation at 25° C. for 3 minutes.

| | |
|---|---|
| Palladium chloride | 0.5 g/l |
| Hydrochloric acid | 0.3 ml/l |
| Thiosemicarbazide | 2 g/l |
| Adjusted to pH 6 with sodium gluconate and sodium acetate. | |

The substrate was then rinsed and immersed in a reducing aqueous bath containing 10 g/l of sodium hypophosphite and 5 g/l of sodium hydroxide at 35° C. for 3 minutes. Then, the substrate was activated with an aqueous solution containing 100 g/l of sulfuric acid in the routine manner and electroplated using the same copper sulfate plating bath as used in Example 1 at 25° C. and 1A/dm$^2$ for 5 minutes.

By the end of the above plating time, the walls defining the through-holes of the substrate had been completely covered with the copper electroplate.

EXAMPLE 4

A drilled, polished double-sided copper clad substrate was treated with an aqueous solution containing 5 g/l of 3-aminopropyltriethoxysilane and 3 g/l of nonionic surfacant at 75° C. for 5 minutes, then rinsed, and immersed in an aqueous solution containing 100 g/l of sulfuric acid (98%) at 25° C. for 3 minutes. The substrate was then rinsed and immersed in an aqueous solution containing 5 g/l of sodium polyoxyethylene lauryl ether sulfate at 25° C. for 1 minute. Thereafter, the substrate was rinsed and treated with a soft etching solution containing 100 ml/l of sulfuric acid (98 %), 100 ml/l of hydrogen peroxide (35%) and 50 ml/l of stabilizer (Trademark: "OPC-450 SOFT ETCH", OKUNO CHEMICAL INDUSTRIES CO., LTD.) at 25° C. for 1 minute for etch-cleaning the copper foil portion. The substrate was then rinsed and immersed in a palladium salt-containing aqueous bath of the following formulation at 25° C. for 3 minutes.

| | |
|---|---|
| Palladium chloride | 0.5 g/l |
| Hydrochloric acid | 0.5 ml/l |
| Dimethylthiourea | 1.5 g/l |
| Adjusted to pH 5 with sodium acetate | |

The substrate was then rinsed and immersed in a reducing aqueous solution containing 5 g/l of sodium borohydride and 3 g/l of sodium hydroxide at 30° C. for 3 minutes.

Thereafter, the substrate was rinsed, activated in the routine manner, and electroplated with the same copper sulfate plating solution as used in Example 1 at 25° C. and 3A/dm$^2$ for 2 minutes.

By the end of the above plating time, the walls defining the through-holes of the substrate had been completely covered with the copper plate.

EXAMPLE 5

A drilled, polished double-sided copper-clad substrate was treated with an aqueous solution containing 7 g/l of N-2-(aminoethyl)-3-aminopropyltrimethoxysilane and 2 g/l of nonionic surfactant at 75° C. for 3 minutes, after which it was rinsed and treated with a soft etching solution containing 70 ml/l of sulfuric acid (98 %), 50 ml/l of hydrogen peroxide (35%) and stabilizer (Trademark: "OPC-450 SOFT ETCH", OKUNO CHEMICAL INDUSTRIES CO., LTD.) at 25° C. for 2 minutes for etch-cleaning the copper foil portion. The substrate was then rinsed and immersed in an aqueous solution containing 5 g/l of polyoxyethylene alkylphenyl ether phosphate at 25° C. for 2 minutes. Then, the substrate was thoroughly rinsed and immersed in a palladium salt-containing aqueous bath of the following formulation at 20° C. for 2 minutes.

| | |
|---|---|
| Palladium chloride | 0.75 g/l |
| Hydrochloric acid | 1 ml/l |
| Thiourea | 5 g/l |
| Adjusted to pH 9 with N-hydroxyethylethylenediamine | |

The substrate was then rinsed and immersed in a reducing aqueous solution containing 10 g/l of glyoxylic acid and 10 g/l of sodium hydroxide at 35° C. for 3 minutes.

Thereafter, the substrate was rinsed again, activated in the routine manner, and subjected to copper electroplating using the copper sulfate bath shown in Example 1 at 25° C. and 2.5A/dm$^2$ for 2 minutes.

By the end of the above plating time, the walls defining the through-holes of the substrate had been completely covered with the copper plate.

EXAMPLE 6

The steps of Example 1 were repeated except that a 4-layer laminate board desmeared with a permanganate solution in the routine manner was used as the substrate.

By the end of the plating step, the walls defining the through-holes of the substrate had been completely covered with the copper plate.

EXAMPLE 7

A 4-layer laminate board desmeared with a permanganate solution in the routine manner was treated by the same procedures as described in Example 2.

However, after immersion in said reducing aqueous solution, the substrate was thoroughly rinsed and dried and a circuit pattern was formed with a plating resist. Then, in the routine manner, the substrate was subjected to acid degreasing and soft etching. Thereafter, using the copper sulfate plating bath described in Example 1, pattern plating was performed at 25° C. and 2.5 A/dm$^2$ for 50 minutes. Then, the substrate was subjected to solder plating, resist stripping, and etching to complete a circuit pattern.

The circuit pattern thus constructed was subjected to a hot oil cycle test of 260° C.-5 seconds and 20° C-20 seconds. As a result, the change in circuit resistance was not more than 2% even after 100 cycles, demonstrating the high reliability of the process of this invention.

INDUSTRIAL APPLICABILITY

In accordance with the process of this invention, an electroplating layer can be directly formed on an electrically nonconductive substrate without resort to electroless copper plating. Therefore, compared with the prior art technology involving electroless plating as an essential step, the processing time till formation of an electroplating layer is remarkably curtailed to about one-half, thus insuring a great commercial advantage.

We claim:

1. A process for plating an electrically conductive substrate comprising the following steps:
   (1) a step of treating an electrically nonconductive substrate with a solution containing a silane coupling agent;
   (2) a step of treating the electrically nonconductive substrate from said step (1) with a solution containing an anionic surfactant;
   (3) a step of treating the electrically nonconductive substrate from said step (2) with a solution containing a palladium compound and at least one nitrogen-containing sulfur compound selected from among thiourea and its derivatives;
   (4) a step of treating the electrically nonconductive substrate from said step (3) with a reducing solution containing at least one member selected from among sodium borohydride, sodium hypophosphite, hydrazine, dimethylaminoborane, hydroxylamine and glyoxylic acid; and
   (5) a step of forming an electroplating layer on the electrically nonconductive substrate from said step (4).

2. The plating process claimed in claim 1 wherein concentration of palladium ion in the treating solution for use in said step (3) is within the range of 0.1–10 g/l and concentration of said nitrogen-containing sulfur compound is within the range of 1–50 moles per mole of said palladium ion in the same solution.

3. The plating process claimed in claim 2 wherein said nitrogen-containing sulfur compound is a compound selected from among thiourea, thioacetamide, thiosemicarbazide and dimethylthiourea.

4. A through-hole plating process for a printed circuit board comprising treating a double-sided printed circuit board or a multi-layer printed circuit board in the following steps:
   (1) a step of treating a drilled, polished and cleaned printed circuit board with a solution containing a silane coupling agent;
   (2) a step of treating the printed circuit board from said step (1) with a solution containing an anionic surfactant;
   (3) a step of treating printed circuit board from said step (2) with a solution containing a palladium compound and at least one nitrogen-containing sulfur compound selected from among thiourea and its derivatives;
   (4) a step of treating the printed circuit board from said step (3) with a reducing solution containing at least one member selected from among sodium borohydride, sodium hypophosphite hydrazine, dimethylaminoborane, hydroxylamine and glyoxylic acid; and
   (5) a step of forming an electroplating layer on the printed circuit board from said step (4).

5. The plating process claimed in claim 4 wherein concentration of palladium ion in the treating solution for use in said step (3) is within the range of 0.1–10 g/l and concentration of said nitrogen-containing sulfur compound is within the range of 1–50 moles per mole of said palladium ion in the same solution.

6. The plating process claimed in claim 5 wherein said nitrogen-containing sulfur compound is a compound selected from among thiourea, thioacetamide, thiosemicarbazide and dimethylthiourea.

* * * * *

UNITED STATES PATENT AND TRADEMARK OFFICE
CERTIFICATE OF CORRECTION

PATENT NO.:    5,616,230
DATED     :    April 1, 1997
INVENTOR(S):   Kuniaki OTSUKA et al.

It is certified that error appears in the above-identified patent and that said Letters Patent is hereby corrected as shown below:

Title page,

Item No. [86] at § 371 Date and § 102(e) Date; please change "January 24, 1995" to --January 20, 1995--

Signed and Sealed this

Twenty-first Day of October 1997

Attest:

BRUCE LEHMAN

Attesting Officer                Commissioner of Patents and Trademarks